(12) United States Patent
Horn et al.

(10) Patent No.: US 10,014,978 B2
(45) Date of Patent: Jul. 3, 2018

(54) METHOD AND APPARATUS FOR PROCESSING A DATA SIGNAL

(71) Applicant: Rohde & Schwarz GmbH & Co. KG, München (DE)

(72) Inventors: Armin Horn, Newberg, OR (US); John Galbraith, Portland, OR (US); Joe Zhang, Lake Oswego, OR (US); Robin Hoeye, Oregon City, OR (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 64 days.

(21) Appl. No.: 14/841,557

(22) Filed: Aug. 31, 2015

(65) Prior Publication Data

US 2017/0063492 A1    Mar. 2, 2017

(51) Int. Cl.
  *H03D 1/00*      (2006.01)
  *H04L 27/06*    (2006.01)
  *H04L 1/00*      (2006.01)
  *H04L 7/04*      (2006.01)

(52) U.S. Cl.
  CPC ............ *H04L 1/0047* (2013.01); *H04L 7/044* (2013.01)

(58) Field of Classification Search
  CPC ....... H04L 1/0047; H04L 7/04; H04L 43/045; H04L 43/18
  See application file for complete search history.

(56) References Cited

U.S. PATENT DOCUMENTS

| | | | | |
|---|---|---|---|---|
| 5,351,287 A | * | 9/1994 | Bhattacharyya | ........ H04M 3/38 379/188 |
| 7,403,560 B2 | * | 7/2008 | Gamper | ............. G01R 13/0209 375/228 |
| 7,860,674 B2 | | 12/2010 | Freidhof et al. | |
| 2003/0131288 A1 | * | 7/2003 | Takahashi | ................. H04L 1/24 714/43 |
| 2008/0144654 A1 | * | 6/2008 | Frishberg | ............... H04L 43/045 370/466 |
| 2013/0111076 A1 | * | 5/2013 | Vaynberg | ............. G06F 11/3041 710/18 |
| 2013/0125006 A1 | * | 5/2013 | Rule | ....................... H04L 41/22 715/738 |

* cited by examiner

*Primary Examiner* — Shuwang Liu
*Assistant Examiner* — Sung Ahn
(74) *Attorney, Agent, or Firm* — Shumaker & Sieffert, P.A.

(57) ABSTRACT

An apparatus and method for processing a data signal transferred using a specific data protocol, DP, said apparatus comprising a decoding unit configured to decode stepwise the data signal according to the used data protocol, wherein said decoding unit is adapted to decode in a decoding step rising and falling signal edges as an intermediate decoding result; and a decoding result labelling unit configured to provide intermediate decoding result labels, L, for the data signal, DS, after each decoding step performed by said decoding unit and configured to map the provided decoding result labels, L, to the data signal, DS.

24 Claims, 10 Drawing Sheets

METHOD AND APPARATUS FOR PROCESSING A DATA SIGNAL

BACKGROUND OF THE INVENTION

The present invention relates generally to a method and apparatus for processing a data signal transferred using a specific data protocol.

In a data communication system, messages, in particular control messages, can be transmitted through a communication channel which can comprise at least one signal line. The signal line can be a physical wire or a data line of a data bus. For fault detection, measurement instruments such as oscilloscopes are used to decode and analyze a captured data signal.

Oscilloscopes allow observation of constantly varying input signals. Oscilloscopes are used to observe a change of an electrical signal over time displayed on a display unit of the oscilloscope. The observed waveform of the captured signal can be analyzed for signal properties such as amplitude, frequency, rise time, time interval, distortion. Conventional oscilloscopes can calculate these signal properties directly and display them to the user. A storage oscilloscope allows single events to be captured by the instrument which can be displayed on the display unit of the oscilloscope.

FIG. 1 shows a block diagram of a conventional digital oscilloscope. The illustrated digital oscilloscope comprises a preamplifier PA providing a variable amplification factor amplifying the input signal. After level matching, the preamplified analog measured signal can be supplied to an analog digital converter ADC for conversion into a corresponding digital data format. A digital oscilloscope further can comprise a unit COMP for compensation of delay times to compensate different delay times in the measurement channels associated with the individual measured signals. Further, an equalizer EQ can be provided which implements an equalization of the linear or respectively non-linear, distorted, digitized measured signals as shown in FIG. 1. Further, a digital triggering system TRIG can be provided. After equalization, the digitized measured signal is checked by the digital triggering system with reference to an adjustable triggering condition, and in the case of an identification of this triggering condition, the triggering signal for triggering the digital oscilloscope is generated in the measured signal at the output of the digital triggering system. Those sampled values of the digitized, equalized measured signal, which are registered simultaneously with the triggering signal or immediately following the triggering signal in time are displayed on a screen of a display unit DIS or recording unit of the respective digital oscilloscope as illustrated in FIG. 1.

Some conventional oscilloscopes provide a function to display a binary representation of the captured analog signal, for instance on a specific display area of the display unit of the oscilloscope. The captured data signals often represent a data bit stream transferred via a data bus line of a data bus from a data source such as a first processing unit to a data sink formed by another processing unit. These bit streams represent messages transferred via said data line according to a predetermined communication data protocol. The data protocol is a convention that can define the order and meaning of data bits in the digital data bit stream. Typically, a message comprises a predetermined data structure according to the used data protocol. The transported data signal can be damaged during transmission from a data source to a data sink so that one or several data bits are faulty. These faults data bits can cause that a decoding of the received data messages at the receiving data sink fails. A measurement apparatus such as an oscilloscope can be used to find the reason why and where a failure during data transmission has occurred. The decoding on the receiving side comprises normally a sequence of decoding steps which are performed in a decoding process. A conventional oscilloscope does not provide means to analyze each decoding process step of the decoding process separately in case that decoding fails.

SUMMARY OF THE INVENTION

The present invention provides according to a first aspect a method for processing a data signal transferred using a data protocol.

The invention provides according to the first aspect a method for processing a data signal transferred using a data protocol,
said method comprising the steps of:
performing at least one decoding step of a decoding process for decoding the data signal according to the used data protocol,
wherein, in a decoding step of said decoding process rising and falling signal edges of the data signal are detected as an intermediate decoding result,
providing decoding result labels for the partially decoded data signal after each decoding step of said decoding process and
mapping the provided decoding result labels to the data signal.

In a possible embodiment of the method according to the first aspect of the present invention, the analog data signal is acquired and converted into a data signal trace displayed on a display unit.

In a further possible embodiment of the method according to the first aspect of the present invention, the rising and falling signal edges of the data signal detected as an intermediate decoding result are labelled with corresponding signal edge labels.

In a still further possible embodiment of the method according to the first aspect of the present invention, in a decoding step, data bits of the data signal are detected as an intermediate decoding result and labelled with corresponding bit labels.

In a further possible embodiment of the method according to the first aspect of the present invention, in a decoding step of the decoding process, data bits of the synchronized data signal are detected as an intermediate decoding result and labelled with corresponding synchronized bit labels.

In a further possible embodiment of the method according to the first aspect of the present invention, in a further decoding step of the decoding process, data symbols are derived on the basis of the data bits depending on a line code of the data protocol as an intermediate decoding result and labelled with corresponding data symbol labels.

In a still further possible embodiment of the method according to the first aspect of the present invention, in a further decoding step of the decoding process, data words are derived on the basis of the data symbols as an intermediate decoding result and labelled with corresponding data word labels.

In a still further possible embodiment of the method according to the first aspect of the present invention, in a further decoding step of the decoding process, structured data fields of a data frame are derived on the basis of the data words as an intermediate decoding result and labelled with corresponding data field labels.

In a further possible embodiment of the method according to the first aspect of the present invention, in a further decoding step of the decoding process, protocol messages of the used data protocol are derived on the basis of the structured data fields as a final decoding result and labelled with corresponding protocol message labels.

In a further possible embodiment of the method according to the first aspect of the present invention, the decoding result labels comprise honeycomb-shaped decoding result labels read from a label library stored in a memory unit.

In a further possible embodiment of the method according to the first aspect of the present invention, the decoding result labels of the partially decoded data signal provided after a decoding step of the decoding process are mapped to the data signal and displayed along with a data signal trace of the data signal on a display unit.

In a further possible embodiment of the method according to the first aspect of the present invention, the data protocol used for decoding the transported data signal is selected by a control unit or by a user via a user interface.

In a further possible embodiment of the method according to the first aspect of the present invention, the decoding step of the decoding process is selected by a control unit or by a user via a user interface.

In a still further possible embodiment of the method according to the first aspect of the present invention, a specific label level is selected by a control unit or by a user via a user interface.

The invention further provides according to a second aspect of the present invention an apparatus for processing a data signal transferred using a specific data protocol.

The invention provides according to the second aspect an apparatus for processing a data signal transferred using a specific data protocol,
said apparatus comprising
a decoding unit configured to decode stepwise the data signal according to the used data protocol,
wherein said decoding unit is adapted to decode in a decoding step rising and falling signal edges as an intermediate decoding result; and
a decoding result labelling unit configured to provide intermediate decoding result labels for the data signal after each decoding step performed by the decoding unit and configured to map the provided decoding result labels to the data signal.

In a possible embodiment of the apparatus according to the second aspect of the present invention, a user interface is provided adapted to select a data protocol and/or a decoding step for decoding a data signal using said data protocol and/or to select a label level for labelling the data signal, and/or to select a decoding result label, L, at a selected label level.

In a possible embodiment of the apparatus according to the second aspect of the present invention, the apparatus comprises a memory unit adapted to store decoding result labels for intermediate and/or final decoding results provided by a decoding step performed by the decoding unit of said apparatus.

In a possible embodiment of the apparatus according to the second aspect of the present invention, the decoding result labels for intermediate and/or final decoding results comprise bit labels, synchronized bit labels, signal edges, data symbols, data words, data fields and protocol messages of the used data protocol.

In a possible embodiment of the apparatus according to the second aspect of the present invention, the apparatus further comprises an analyzing unit configured to analyze the data signal with the mapped decoding result labels for fault detection in the transferred data signal.

In a possible embodiment of the apparatus according to the second aspect of the present invention, the analyzing unit is configured to detect faulty protocol messages in a sequence of decoded protocol messages and is further configured to evaluate for each faulty protocol message an associated label sequence of a selected label level for said faulty protocol message to identify a correct substitute protocol message.

In a further possible embodiment of the apparatus according to the second aspect of the present invention, the detected faulty protocol message is automatically marked by said analyzing unit as faulty and substituted by the identified substitute protocol message.

In a still further possible embodiment of the apparatus according to the second aspect of the present invention, the apparatus comprises a display unit configured to display a data signal trace of said data signal along with the decoding result labels of a selected label level.

The invention further provides according to a third aspect an oscilloscope.

The invention provides according to the third aspect an oscilloscope comprising
a processing unit for processing a data signal, DS, transferred using a specific data protocol,
said processing unit having:
a decoding unit configured to decode stepwise the data signal according to the used data protocol,
wherein said decoding unit is adapted to decode in a decoding step rising and falling signal edges of the data signal as an intermediate decoding result, and
a decoding result labelling unit configured to provide intermediate decoding result labels for the data signal after each decoding step performed by said decoding unit and configured to map the provided decoding result labels to the data signal;
said oscilloscope further comprising:
a user interface adapted to select a data protocol and/or a decoding step of said decoding process for decoding the data signal using the data protocol and/or to select a label level of decoding result labels; and
a display unit configured to display a data signal trace of said data signal along with decoding result labels of the selected label level provided by said decoding result labelling unit.

The invention further provides according to a fourth aspect a method for processing a data signal transferred using a specific data protocol.

The invention provides according to the fourth aspect a method for processing a data signal transferred using a data protocol,
the method comprising the steps of:
detecting in a decoding step rising and falling signal edges of the data signal,
providing a corresponding signal edge label for each detected signal edge, and
mapping the provided signal edge labels to the data signal.

The invention further provides according to the fifth aspect an apparatus for processing a data signal transferred using a data protocol.

The invention provides according to the fifth aspect an apparatus for processing a data signal transferred using a data protocol,
said apparatus comprising
a decoding unit configured to detect in a decoding step rising and falling signal edges of the data signal, and a decoding result labelling unit configured to provide corresponding signal edge labels for each detected signal edge and configured to map the provided signal edge labels to the data signal.

The invention further provides according to a sixth aspect a computer program comprising instructions adapted to perform a method for processing a data signal according to the first aspect of the present invention.

The invention provides further according to a seventh aspect a computer program comprising instructions adapted to perform a method for processing a data signal according to the fourth aspect of the present invention.

BRIEF DESCRIPTION OF THE DRAWINGS

Various exemplary embodiments of the different aspects of the present invention are illustrated by way of example, and not by way of limitation, in the figures of the accompanying drawings in which like reference numerals refer to similar elements and in which.

DETAILED DESCRIPTION OF POSSIBLE EMBODIMENTS

Figure 1:
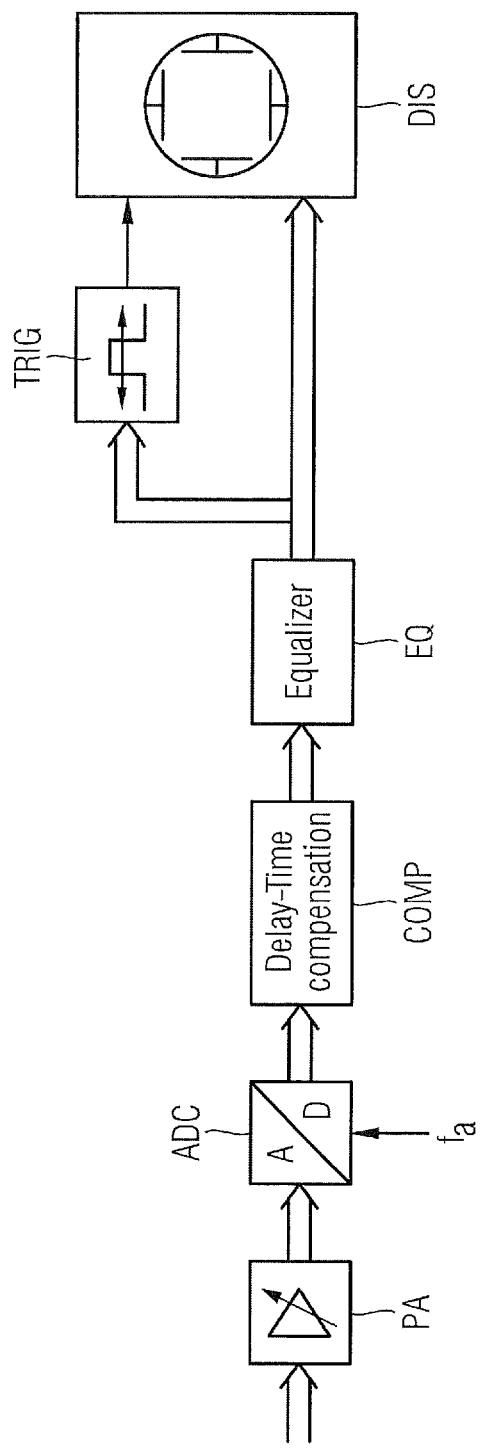
FIG. 1 shows a block diagram of a conventional oscilloscope for analyzing a data signal.
Figure 2:
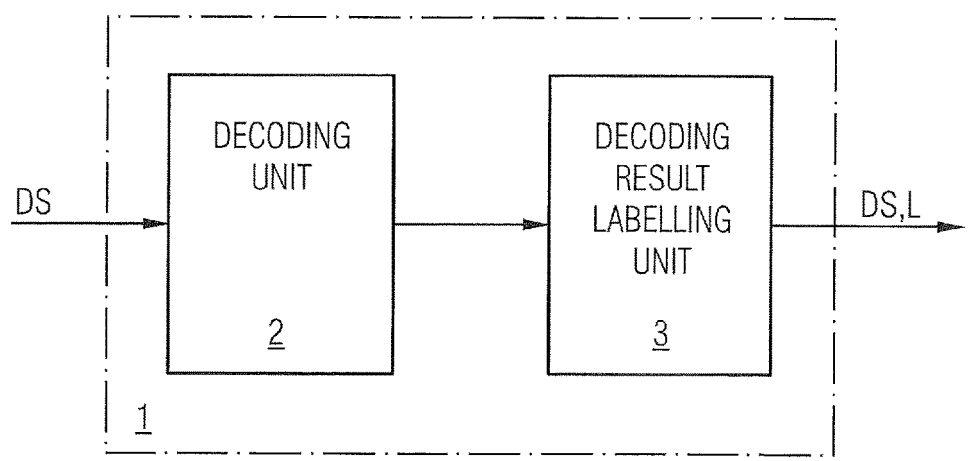
FIG. 2 shows a block diagram of an exemplary embodiment of an apparatus for processing a data signal according to an aspect of the present invention.

FIG. 2 shows a block diagram of a possible exemplary embodiment of an apparatus 1 for processing a data signal DS transferred using a specific data protocol. The data signal DS can be transported in a possible embodiment via a data line of a data bus. The data signal DS can for example comprise a continuous data bit stream transmitted from a data source to a data sink via a serial data bus. The apparatus 1 comprises in the illustrated embodiment a decoding unit 2 configured to decode stepwise the captured data signal according to a data protocol DP. The apparatus 1 comprises in the illustrated embodiment further a decoding result labelling unit 3 configured to provide intermediate decoding result labels L for the data signal after each decoding step performed by said decoding unit 2. The decoding result labelling unit 3 is further configured to map the provided decoding result labels L to the respective data signal DS. In a possible embodiment of the apparatus 1 as shown in FIG. 2, the decoding unit 2 is adapted to decode in a decoding step of the decoding process performed by the decoding unit 2 rising and/or falling signal edges as an intermediate decoding result. In a possible embodiment, the decoding unit 2 and the decoding result labelling unit 3 are integrated in a processing unit.

Figure 3:
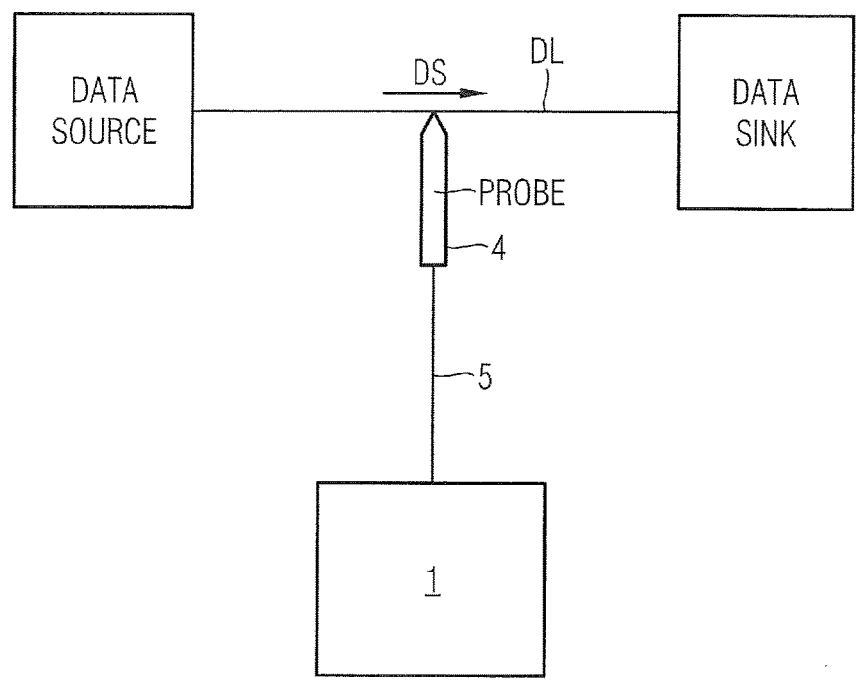
FIG. 3 shows a block diagram for illustrating a possible use of an oscilloscope according to a further aspect of the present invention.

FIG. 3 shows a diagram for illustrating the operation of the apparatus 1 as shown in FIG. 2. In the shown use case, a data signal DS is transferred via a data line DL from a data source to a data sink. The data line DL can form part of a data bus connecting the data source and the data sink. The bus can be a serial or a parallel data bus of a system. The data bus can be for instance a USB data bus or a CAN data bus. The data signal DS is encoded by the data source according to a specific data protocol DP and transported in a continuous bit stream to the data sink where the received data signal DS is decoded according to the specific data protocol DP used for data communication between the data source and the data sink. For finding and analyzing data faults during data communication, the apparatus 1 as illustrated in FIG. 2 can be attached to the investigated system or a data bus by means of a probe 4 as illustrated in FIG. 3. The probe 4 captures the data signal DS and supplies it via a signal line 5 to an input port of the apparatus 1. In a possible embodiment, the transferred or transported analog data signal DS is preamplified and then converted by an analog digital converter ADC into a digital data format within the apparatus 1 for further processing. This processing can comprise a preprocessing, in particular a delay time compensation and a signal equalization. The preprocessed signal can be provided to the decoding unit of the apparatus 1 as shown in FIG. 2. In a possible embodiment, the received data signal and/or the preprocessed data signal can be stored for example in a data memory of the apparatus 1 for further processing.

Figure 4:
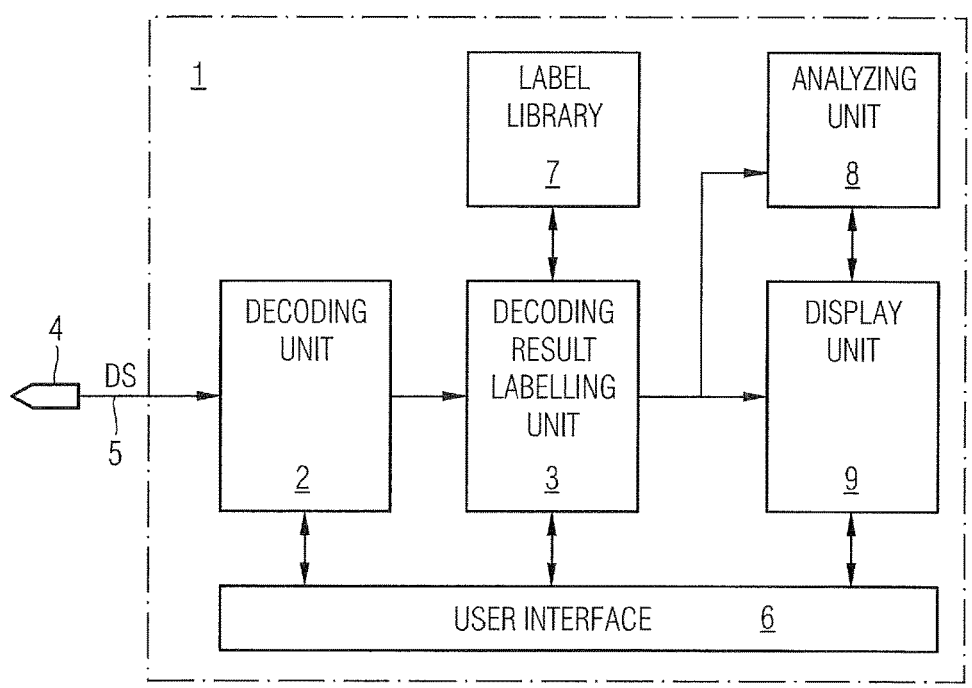
FIG. 4 shows a block diagram of a possible exemplary embodiment of an oscilloscope according to an aspect of the present invention.

FIG. 4 shows a possible exemplary embodiment of an apparatus 1 according to an aspect of the present invention. The digital signal DS is supplied by the probe 4 via line 5 to the decoding unit 2 and decoded by the decoding unit 2 stepwise according to a predetermined decoding process corresponding to the used data protocol DP. The decoding result labelling unit 3 of the apparatus 1 is configured to provide intermediate decoding result labels L for the data signal DS after each decoding step performed by the decoding unit 2 and is further configured to map the provided decoding result labels L to the respective data signal DS. In the illustrated embodiment of FIG. 4, the apparatus 1 comprises a user interface 6. By means of the user interface 6, a user can select a specific data protocol DP from a group of available data protocols. For each available data protocol, a different sequence of decoding steps can be stored in a memory of the decoding unit 2. In most cases, the data protocol DP used for data transmission is known and can be selected by the user by means of the user interface 6. In a possible embodiment, the user can further select by means of the user interface 6 a decoding step in the sequence of decoding steps of a decoding process provided for the respective data protocol DP. In a further possible embodiment, the user can further select or set a label level LL for labelling the data signal DS by the decoding result labelling unit 3 of the apparatus 1. In the illustrated embodiment of FIG. 4, the apparatus 1 further comprises a memory unit 7 adapted to store decoding result labels L for intermediate and/or final decoding results provided by a decoding step performed by the decoding unit 2 of the apparatus 1. The decoding result labels L stored in the memory unit 7 for intermediate and/or final decoding results can comprise in a possible embodiment bit labels B, synchronized bit labels SB, signal edges E, data symbols SYMB, data words DW, data fields DF, and protocol messages DM and/or protocol message identifiers of the used data protocol DP.

In the embodiment illustrated in FIG. 4, the apparatus 1 further comprises an analyzing unit 8 configured to analyze the data signal with the mapped decoding result labels L for fault detection in the transferred data signal DS. In a possible embodiment, the analyzing unit 8 is configured to detect faulty protocol messages in a sequence of received decoded protocol messages. The analyzing unit 8 can be further configured to evaluate for each faulty protocol message an associated label sequence of a selected label level LL to identify a correct substitute protocol message for the respective faulty protocol message. In a possible embodiment, the detected faulty protocol message is automatically marked by the analyzing unit 8 of the apparatus 1 as being faulty and then automatically substituted by the identified substitute protocol message. In a possible embodiment, the analyzing results provided by the analyzing unit 8 are recorded in a recording unit and output via a data interface of the apparatus 1. The apparatus 1 further comprises in the shown embodiment a display unit 9 configured to display a data signal trace A of the data signal along with the decoding result labels L of the selected label level LL.

Figure 5:
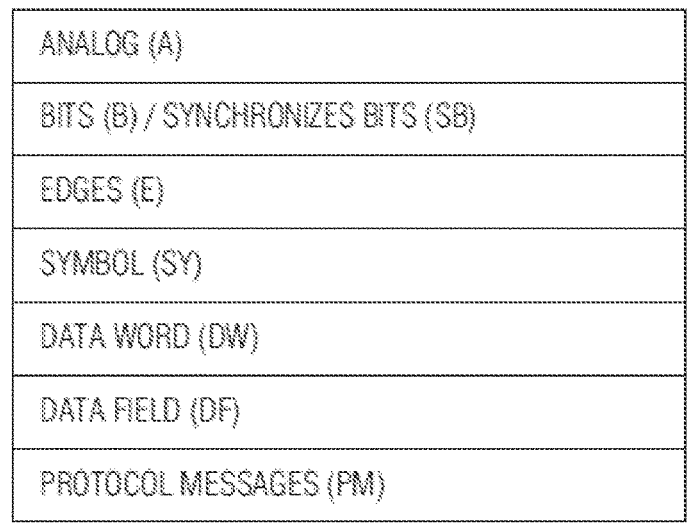
FIG. 5 shows a table for illustrating possible label levels as used by the method and apparatus according to the present invention.

The apparatus 1 according to an aspect of the present invention offers the functionality of selecting different label levels LL as illustrated in the table of FIG. 5. The captured digital signal can be displayed by means of the display unit 9 as a data signal trace A as illustrated in FIG. 7A. The analog data signal is acquired and converted into a data signal trace A displayed on the display unit 9. By using adjustable thresholds, data bits can be provided in a subsequent decoding step as an intermediate decoding result and labelled with corresponding bit labels B. In a possible embodiment, the data bit stream can be synchronized by using a predetermined synchronization bit stream pattern. In a possible embodiment, in a decoding step of the decoding process the data bits of a synchronized data signal can be detected as an intermediate decoding result and labelled with corresponding synchronized bit labels SB. In a further possible decoding step of the decoding process performed by the decoding unit 2, data symbols are derived on the basis of the generated data bits depending on a line code of the data protocol DP as an intermediate decoding result and labelled with corresponding data symbol labels SYMB.

Line coding comprises the representation of a data signal to be transported by an amplitude- and time-discrete signal for adapting the signal to the specific channel properties of the physical channel. A waveform pattern of a voltage or current used to represent logical high and logical low bits of the data signal via a transmission line represents the employed line code. Common types of line coding are for instance unipolar, bipolar and Manchester encoding. Common line codes used in communication systems comprise for instance AMI, 2B1Q, 4B5B, 4B3T, RZ (Return-to-Zero), NRZ (Non-return-to-Zero) and Manchester code. Further possible line codes used by a transmission system comprise MLT-3 Encoding, Hybrid Ternary Codes, Hamming Code or Coded Mark Inversion, CMI.

In a decoding step performed by the decoding unit 2 of the apparatus 1, the data symbols are derived on the basis of the data bits depending on the employed line code of the respective data protocol DP as an intermediate decoding result and labelled with corresponding data symbols SYMB as illustrated for example in the signal diagram of FIG. 7D.

In a further possible embodiment, in a further decoding process performed by the decoding unit 2, data words are derived on the basis of the data symbols and/or on the basis of data bits as intermediate decoding results and labelled with corresponding data word labels DW.

In a further possible decoding step of the decoding process performed by the decoding unit 2 for the respective data protocol DP, structured data fields of a data frame are derived on the basis of the data words as a further intermediate decoding result and labelled with corresponding data field labels DF.

In a further possible embodiment, in a further decoding step of the decoding process performed by the decoding unit 2 for the respective decoding protocol, protocol messages of the used data protocol are derived on the basis of the structured data fields as a final decoding result and labelled with corresponding protocol message labels PM.

As can be seen in FIG. 5, the selectable label levels LL are hierarchically and represent different decoding steps performed during a decoding process for decoding a data signal DS using a specific data protocol. The number and type of the label levels LL can vary depending on the selected data protocol used for data transmission of the data signal DS. In a possible embodiment, the user interface 6 of the apparatus 1 comprises a selection switch or input keys for selecting a data protocol DP and/or one or several label levels LL available for the respective data protocol DP.

Figure 6:
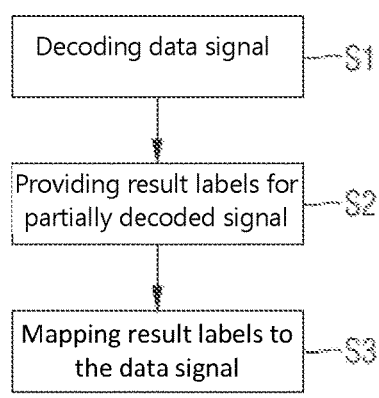
FIG. 6 shows a flowchart of an exemplary embodiment of a method for processing a data signal according to an aspect of the present invention.

FIG. 6 shows a flowchart of a possible exemplary embodiment of a method for processing a data signal transferred using a data protocol DP according to the first aspect of the present invention.

In a first step S1 of the method, at least one decoding step of a decoding process for decoding the data signal is performed according to the used data protocol DP. In a possible embodiment, in a decoding step of said decoding process rising and/or falling signal edges of the data signal DS are detected as an intermediate decoding result.

In a further step S2, decoding result labels L for the partially decoded data signal are provided by the decoding result labelling unit 3 after each decoding step of the respective decoding process performed by the decoding unit 2 for the respective data protocol DP.

In a further step S3, the provided decoding result labels L are mapped by the decoding result labelling unit 3 to the data signal DS.

In a possible embodiment of the method as illustrated in FIG. 6, the analog data signal DS is acquired and converted into a data signal trace A displayed on a display unit. The rising and falling signal edges of the data, DS, signal detected as an intermediate decoding result in step S1 are labelled in a preferred embodiment with corresponding signal edge labels E. In a possible embodiment, the used decoding result labels can comprise honeycomb-shaped decoding result labels L read from a label library stored in a database or memory unit. The decoded result labels L of the partially decoded data signal provided after each decoding step of the decoding process performed by the decoding unit 2 are mapped to the data signal and displayed along with the data signal trace A of the data signal DS on a display unit. In a possible embodiment of the method as illustrated in FIG. 6, the data protocol DP used for decoding the transported data signal and/or the decoding step and/or a label level LL is selected by a control unit or by a user via a user interface.

FIGS. 7A, 7B, 7C, 7D, 7E illustrate a possible exemplary implementation of the method and apparatus for processing a data signal transport using a data protocol, DP.

Figure 7:
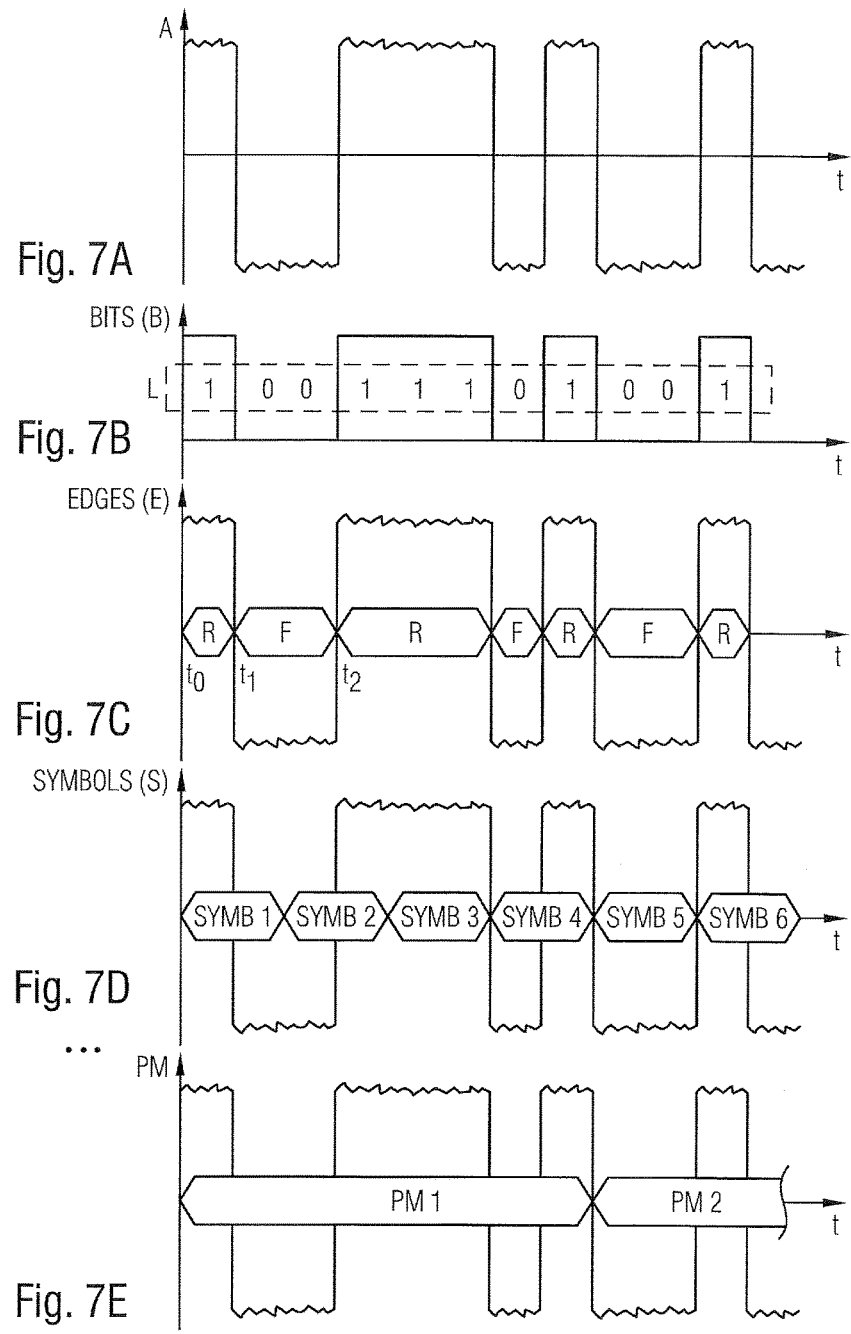
FIGS. 7A, 7B, 7C, 7D, 7E show exemplary signal diagrams for illustrating a possible operation of the method and apparatus according to the present invention.

FIG. 7A illustrates a captured and converted data signal trace A which can be displayed on a display unit. The data signal trace A represents data signals transferred in a possible embodiment via a data line from a data source to a data sink as illustrated in FIG. 3. In a decoding step, data bits of the data signals DS are detected by using adjustable thresholds TH. These data bits can also be displayed on the display unit as illustrated in FIG. 7 along with corresponding bit labels 1, 0. For example, a user can select as a label level LL a display of bit values 1, 0 labelling the illustrated signal as shown in FIG. 7B. In a possible embodiment, the rising and falling signal edges of the data signal DS detected as an intermediate decoding result are labelled with corresponding signal edge labels E as shown in FIG. 7C. In the illustrated embodiment, the label R indicates a rising signal edge and the label F indicates a falling signal edge. In the illustrated exemplary embodiment, the signal comprises a rising signal edge at a time $t_0$ and a falling signal edge at a time $t_1$. The signal rises again at a time $t_2$. During the time period between $t_0$ and $t_1$, the signal edge label R is mapped to the data signal DS and can be displayed along with the data signal trace A on a display unit. The signal edge label F is mapped to the data signal between time $t_1$ and time $t_2$ and is displayed along with the corresponding data signal trace A on the display unit.

In a possible decoding step of the decoding process performed by the decoding unit 2, the data symbols are derived on the basis of the data bits depending on the line code used or employed by the respective data protocol DP as intermediate decoding results and labelled with corresponding data symbol labels SYMB as illustrated in FIG. 7D. For example, two bits of the data stream can represent one data symbol of the data stream DS as shown in FIG. 7D. The mapped decoding result labels SYMB can be displayed on a display unit along with the corresponding captured data signal trace A as shown in FIG. 7D. In the shown embodiment, the decoding result labels comprise honeycomb-shaped decoding results labels L identifying the respective data symbols as labels SYMB1, SYMB2, SYMB3, SYMB4, SYMB5, SYMB6 as shown in FIG. 7D.

In a possible embodiment, in a further decoding step of the decoding process performed by the decoding unit data words are derived on the basis of the data symbols as a further intermediate decoding result and labelled with corresponding data word labels DW. In a further decoding step of the decoding process, structured data fields of a data frame can be derived on the basis of the data words as a further intermediate decoding result and labelled with corresponding data field labels DF. In a final decoding step of the decoding process performed by the decoding unit, protocol messages, MSG, of the used data protocol DP can be derived on the basis of the structured data fields as a final decoding result and labelled with corresponding protocol message labels and/or protocol message identifiers PM as shown in FIG. 7E.

In the illustrated example, a first protocol message MSG1 labelled with label PM1 encompasses the first four symbols SYMB1 to SYMB4 of the symbol stream in FIG. 7D. In a possible embodiment of the method and apparatus according to the present invention, the used decoding result labels L can be read from a decoding result label library for labelling intermediate and/or final decoding results and comprise bit labels B, synchronized bit labels SB, signal edges labels, E, data symbol labels, SYMB, data word labels, DW, data field labels, DF and/or protocol message labels, PM and/or protocol message identifiers PM of the used data protocol DP as also shown in the table of FIG. 5.

In a possible embodiment, the data signal DS with the mapped decoding result labels L are analyzed automatically for fault detection of the transferred data signal DS. In a possible embodiment, faulty protocol messages, fMSG, in a sequence of decoded protocol messages, MSG, are detected. For each detected faulty or possibly faulty protocol message MSG an associated sequence of decoding result labels L of a selected label level LL is evaluated to identify a correct substitute protocol message, sMSG, for the respective detected faulty protocol message, fMSG.

Figure 8:
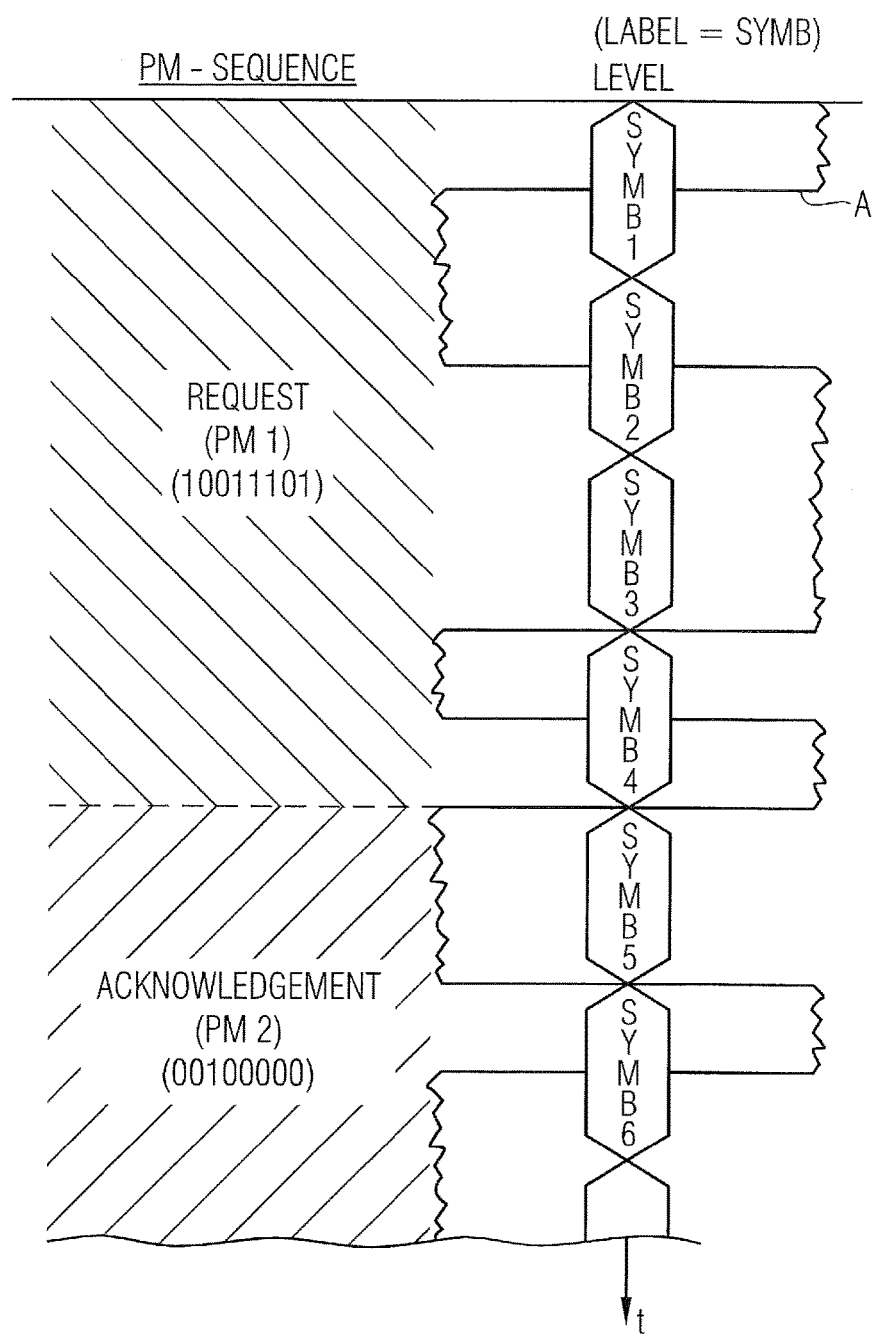
FIG. 8 shows a diagram for illustrating a possible exemplary implementation of an analyzing function provided by the method and apparatus according to the present invention.
Figure 9:
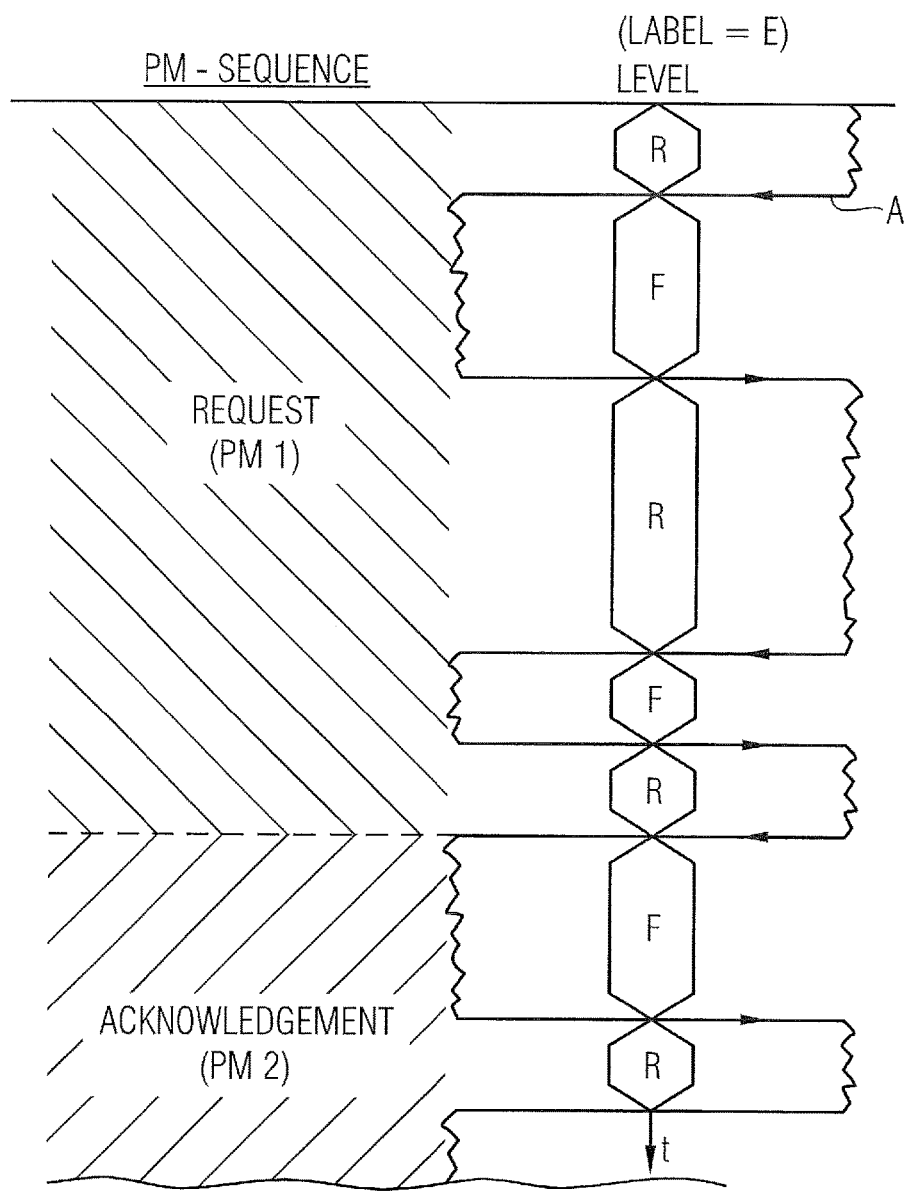
FIG. 9 shows a further diagram for illustrating a possible exemplary implementation for an analyzing function provided by the method and apparatus according to the present invention.

FIG. 8 shows an exemplary protocol message sequence which can be displayed on the display unit 9 of the apparatus 1 illustrated in FIG. 4 in a specific display function mode. The protocol message sequence is a sequence of different protocol messages MSG of a specific data protocol DP. In the given example, the protocol message sequence comprises a first protocol message PM1 "Request" and a second protocol message PM2 "Acknowledgement". The user or a control unit can select a label level LL depending on an intermediate decoding step to be analyzed. In the example illustrated in FIG. 8 the label level LL symbol (LL=SYMB) has been selected. The display unit 9 displays on the left a sequence of protocol messages, wherein each protocol message MSG, labeled with a protocol message label, PM, consists in the shown simple example of four symbols. For example, the first protocol message PM1 "Request" encompasses the symbols SYMB1, SYMB2, SYMB3, SYMB4. The decoding result labels of the completely decoded data signal provided by the final decoding step are formed by the protocol message labels PM which are mapped to the data signal DS and displayed along with a data signal trace A of the data signal on the display unit 9 on the left side as shown in FIG. 8. Further, the decoding result labels SYMB for the partially decoded data signal after the respective decoding step is also provided and mapped to the data signal, DS, and displayed along with the data signal trace A on the display unit 9 on the right side as shown in FIG. 8. The user has the possibility to switch between different label levels LL, for instance between the label levels LL as illustrated in FIG. 5. For example, the user may switch from the label level LL=SYMB as shown in FIG. 8 to the label level LL=E (Edge) as shown in FIG. 9. As can be seen in FIG. 9, the rising and falling signal edge label values R, F for the data signal DS are displayed along with the data signal trace A of the data signal DS associated with the corresponding protocol message, MSG. For example, the first protocol message, MSG labeled PM1 is displayed along with a sequence of rising and falling decoding result labels R, F, R, F, R. At this selected label level LL, a sequence of decoding result labels L associated with the first protocol message, MSG1 is R, F, R, F, R. If the user or control unit switches to another label level LL, such as illustrated in FIG. 8, the sequence of decoded result labels associated with the first protocol message MSG1 is SYMB1, SYMB2, SYMB3, SYMB4.

Each protocol message, MSG, forming part of the final decoding result of the decoding process performed by the decoding unit 2 can be represented at each label level LL with an associated sequence of decoding result labels L.

Figure 10:
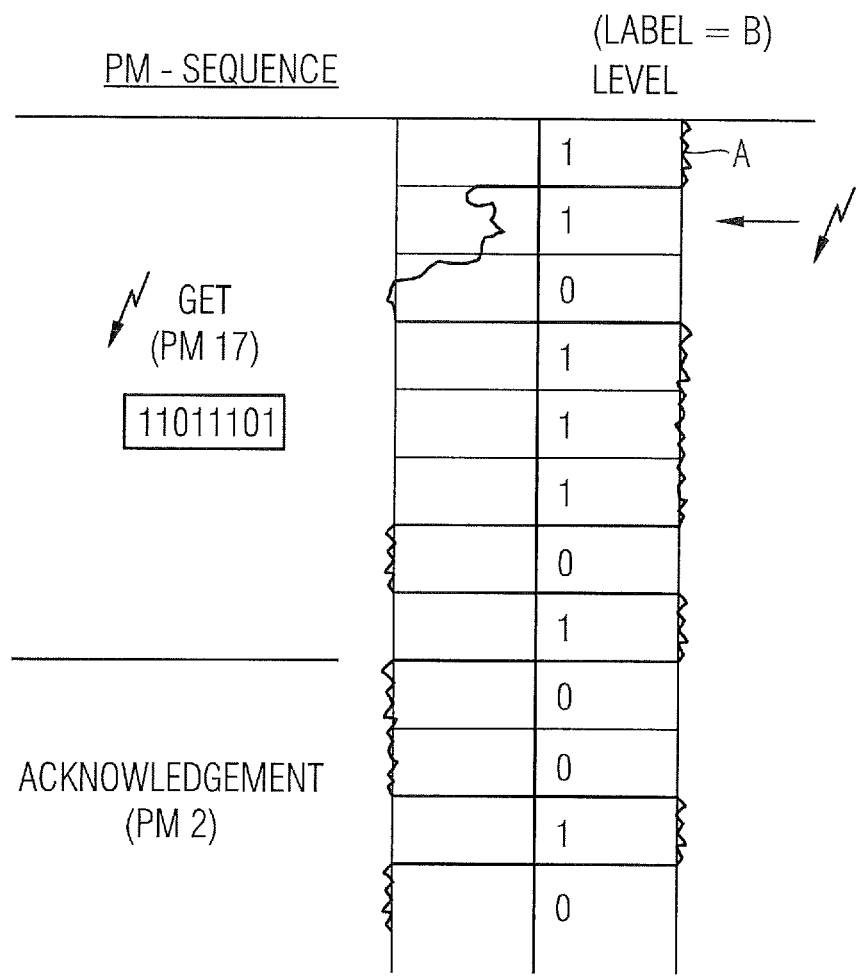
FIG. 10 shows a further diagram for illustrating a possible exemplary implementation of an analyzing function provided by the method and apparatus according to the present invention.

As illustrated in FIG. 10, a user or a control unit can switch to a label level LL where bit values are displayed along with the data signal trace A of the received data signal DS. In a possible embodiment, specific protocol messages in a sequence of decoded protocol messages, MSGs, or suspicious protocol messages in a sequence of decoded protocol messages can be detected or identified. In the illustrated example of FIG. 10, an acknowledgement protocol message, MSG2, labeled PM2 is displayed without that a corresponding request protocol message has been transmitted. For example, the correct request protocol message, MSG1 comprises the bit pattern 10011101 as illustrated in FIG. 8. The protocol message labeled PM17 transmitted before the acknowledgement protocol message, MSG2 labeled PM2 comprises a similar bit pattern 11011101. For analyzing the suspicious protocol message labeled PM17, the control unit or the user can switch to a label level LL to display the bit values along with the data signal trace A as shown in FIG. 10. By analyzing the bit pattern along with the data signal trace A, it can be found in the given example that the second bit of the protocol message labeled PM17 is likely to be erroneous because the analog signal did not reach the corresponding threshold value TH. From the signal form of the analog signal trace A it can be concluded that the second bit of the bit sequence of the protocol message labeled PM17 is possibly wrong and may be substituted by the correct value. By substituting the high logical bit value 1 of the second bit by a logical low bit value 0, a correct protocol message PM1 (request) can be identified. In a further analyzing step, it can be analyzed why the data signal did not reach the respective threshold TH to provide the correct bit.

Each protocol message MSG labeled with a protocol message label, PM, is represented at each label level LL by a sequence of associated intermediate decoding result labels L. A faulty or suspicious protocol message, MSG, can be analyzed in a possible embodiment by evaluating one or several label sequences at different label levels LL. In a possible embodiment, the decoding result label sequence evaluation can be performed automatically for each identified and selected protocol message PM. In a possible embodiment, by processing the different decoding result label sequences for the different label levels LL associated to a protocol message, MSG, a likely correct substitute protocol message, sMSG can be automatically identified. In a possible embodiment, the detected faulty protocol message, fMSG, can be automatically marked as faulty and then substituted by the identified substitute protocol message, sMSG.

The method and apparatus 1 according to the present invention allow to analyze a decoding result at each single intermediate decoding step of a decoding process performed by a decoding unit. It can be identified at which intermediate decoding step a problem may have occurred causing a faulty decoding of the transmitted protocol messages, MSG. Faulty decoding can for instance be caused by an erroneous signal edge detection or a signal transition detection. For instance, if an erroneous signal edge detection has caused the erroneous protocol message decoding, this cause can be further investigated for instance by investigating the signal thresholds or comparator thresholds. The method and apparatus 1 according to the present invention allow for stepwise debugging of a system in case of protocol decoding failures. This debugging can be performed at each single intermediate decoding step. By label level selection, interim results can for instance be displayed by means of honeycomb-shaped labels L. This is helpful when trying to set up the decoding of a new data signal as it allows for a display of primitives (signal transitions, bits etc.) to more complex data structures or data elements. Every level result or data output can be passed to the next decoding step or label level. It is possible to mark the output of each label level, LL, as an interim decoding result. A generic module is able to display this interim decoding results by means of honeycomb-shaped labels. In a possible embodiment, a selection of the different label levels LL can be performed by use of a pop-up parameter.

The method and apparatus according to the present invention can be implemented in an oscilloscope or any other time domain measurement instrument. The method and apparatus according to the present invention can also be implemented in a monitoring control apparatus of a system, in particular embedded system, for monitoring digital signals transferred via data lines DL of a data bus.

In a possible embodiment, the decoding unit 2 of the apparatus 1 can load different decoding processes for different data protocols DPs as a software component from a database. In a possible embodiment, these data protocol software components can be loaded into a corresponding memory of the apparatus 1 via a data interface. Accordingly, the apparatus 1 of the present invention can be adapted flexibly to different data protocols DPs used for transmitting the data signal DS.

In a possible embodiment a decoding result label L can be selected by means of a cursor C moveable on the screen of the display unit 9 under the control of a user or a control unit. In an alternative embodiment the display unit 9 comprises a touch screen and a decoding result label L can be selected by touching the displayed decoding result label L.

In a possible embodiment when selecting a decoding result label L possible values for that label L are displayed to a user in a pop up menu. For instance if a user selects a displayed bit label B the generated pop up menu can display all admissible values for this selected bit label B. If the used line code of the data protocol DP used by the data signal DS is binary these values are 1, 0 (logical H, logical L). If the line code is ternary these admissible values displayed by the pop up menu can comprise the values (−1, 0, +1).

In a possible embodiment the user or a control unit can now select one of the alternative displayed values to investigate the impact of a value change on the subsequent intermediate decoding results and on the final decoding result. The user selects for this purpose one of the other displayed values and the analysing unit 8 calculates or simulates the impact of this value change to the subsequent decoding steps.

For example after having selected the symbol decoding layer SYMB a user can select a specific displayed symbol labeled SYMB X so that alternative symbol values SYMB Y1, SYMB Y2, . . . SYMB Yn are shown in the pop up menu. Then the user selects one of the alternative symbols SYMB Yi to investigate the impact of this value change on the subsequent decoding step intermediate results and on the final decoding result formed by the protocol messages PM. In this way the user has the option to investigate for any subsequent decoding step or for any subsequent decoding stage of the decoding process of the decoding protocol DP used for transmission of the data stream DS the impact of a value change of a suspicious data element at any decoding stage or selected decoding result label level LL.

In a further possible embodiment the user can also select an intermediate result decoding label L such as a falling signal edge label F or a rising signal edge label R and change the duration or length of the displayed label L on the time scale to see the impact of such a change on the subsequent intermediate decoding step results and the final decoding results.

In a still further embodiment the user has the option to input a desired set decoding result such as a sequence of expected protocol messages, MSGs, and the analysing unit 8 generates automatically for each preceding intermediate decoding step of a decoding process to achieve this decoding result the corresponding set label pattern of associated decoding result labels L. In a possible embodiment the set label pattern and the current measured label pattern caused by the captured data signal DS at the selected label level LL can both be displayed on the screen of the display unit 9, wherein differences or deviations between the desired set label pattern and the label pattern of the captured data signal, DS, are high-lighted for investigation by the user.

Figure 11:
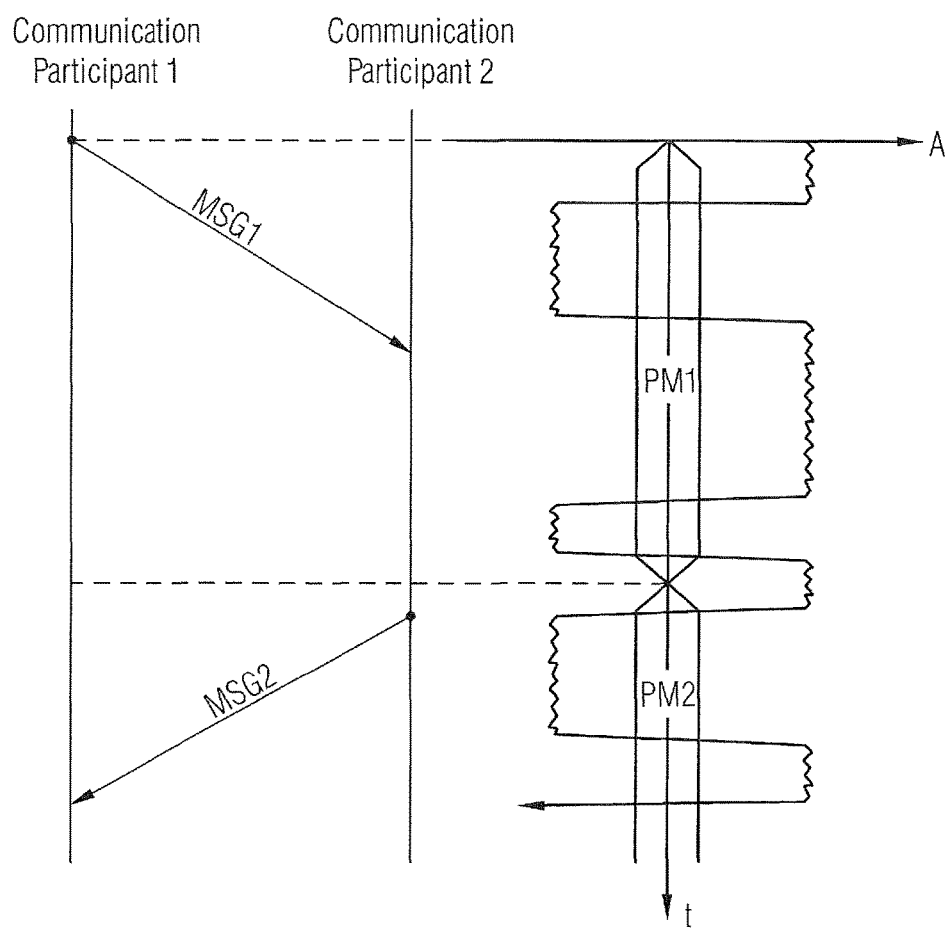
FIG. 11 shows a diagram for illustrating a sequence of protocol messages and corresponding data signal traces according to the present invention.

In a further embodiment as illustrated in FIG. 11 the sequence of decoded protocol messages, MSG, can comprise protocol message labels, PM, output in a message sequence chart, MSC, along with associated decoding result labels, L, of a selected label level, LL, and along the corresponding data signal trace, A, of the respective data signal, DS. The method sequence chart, MSC, can be displayed on a display unit and represents the communication behaviour in an intuitive and transparent manner.

The message sequence chart, MSC, shows from which unit or participant the respective message, MSG, is originally sent. As shown in the example illustrated in FIG. 11, the first communication of participant 1 transmits a message, MSG1, to a communication participant 2 which returns a second protocol message, MSG2, back to the first communication participant 1. The communication participant 1 in turn sends a reply message, MSG3, to the communication participant 2. On the right side the corresponding data signal trace, A, of the respective messages, MSG, is displayed. In the given example, as the selected label level, LL, protocol message labels, PM, are displayed together with the data signal trace, A, as illustrated in FIG. 11. The user can select another label level, LL, to be displayed along with the message sequence chart, MSC, and in the data signal trace, A. The message sequence chart, MSC, as shown in FIG. 11 allows the investigating user to immediately see the communication direction of a transmitted protocol message, MSG. In this way, the user has the possibility to investigate whether specific problems concerning the data transfer occur in both communication directions or only in one communication direction.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

The invention claimed is:

1. A method for processing a data signal, DS, transferred using a data protocol, DP,
said method comprising the steps of:
(a) performing at least one decoding step of a decoding process for decoding the data signal, DS, according to the used data protocol, DP, wherein in a decoding step of said decoding process rising and falling signal edges of the data signal, DS, are detected as an intermediate decoding result;
(b) providing decoding result labels, L, for the partially decoded data signal, DS, after each decoding step of said decoding process; and
(c) mapping the provided decoding result labels, L, to the data signal, DS,
wherein in a decoding step data symbols are derived on the basis of the data bits depending on a line code of said data protocol, DP, as an intermediate decoding result and labelled with corresponding data symbol labels, SYMB; and
wherein in a decoding step data words are derived on the basis of the data symbols as an intermediate decoding result and labelled with corresponding data word labels, DW.

2. The method according to claim 1 wherein an analog data signal forming the data signal, DS, is acquired and converted into a data signal trace, A, displayed on a display unit.

3. The method according to claim 1 wherein the rising and falling signal edges of the data signal, DS, detected as an intermediate decoding result are labelled with corresponding signal edge labels, E.

4. The method according to claim 1 wherein in a decoding step data bits of the data signal, DS, are detected as an intermediate decoding result and labelled with corresponding bit labels, B.

5. The method according to claim 1 wherein in a decoding step data bits of the synchronized data signal are detected as an intermediate decoding result and labelled with corresponding synchronized bit labels, SB.

6. The method according to claim 1 wherein in a decoding step structured data fields of a data frame are derived on the basis of the data words as an intermediate decoding result and labelled with corresponding data field labels, DF.

7. The method according to claim 6 wherein in a decoding step protocol messages, MSG, of the used data protocol, DP, are derived on the basis of the structured data fields as a final decoding result and labelled with corresponding protocol message labels, PM.

8. The method according to claim 1 wherein the decoding result labels, L, comprise honeycomb-shaped decoding result labels read from a label library stored in a memory unit.

9. The method according to claim 1 wherein the decoding result labels, L, of the partially decoded data signal provided after a decoding step are mapped to the data signal and displayed along with a data signal trace, A, of the data signal, DS, on a display unit.

10. The method according to claim 1 wherein the data protocol, DP, used for decoding the transported data signal and/or the decoding step and/or a label level, LL, is selected by a control unit or by a user via a user interface.

11. A method for processing a data signal, DS, transferred using a data protocol, DP,
said method comprising the steps of:
(a) performing at least one decoding step of a decoding process for decoding the data signal, DS, according to the used data protocol, DP, wherein in a decoding step of said decoding process rising and falling signal edges of the data signal, DS, are detected as an intermediate decoding result;
(b) providing decoding result labels, L, for the partially decoded data signal, DS, after each decoding step of said decoding process; and
(c) mapping the provided decoding result labels, L, to the data signal, DS,
wherein the data signal, DS, with the mapped decoding result labels, L, is analyzed for fault detection in the transferred data signal, DS;

wherein in a decoding step protocol messages, MSG, forming the final decoding result are analyzed automatically to detect faulty protocol massages, fMGS, within a sequence of decoded protocol messages, MSGs, wherein for each detected faulty protocol message, fMSG, an associated label sequence of a selected label level, LL, is evaluated to identify a correct substitute protocol message, sMSG.

12. The method according to claim 11, wherein the faulty protocol message, fMSG, is marked as faulty and substituted by the identified substitute protocol message, sMSG.

13. The method according to claim 7, wherein a sequence of decoded protocol messages, MSG, are output in a list and/or in a message sequence chart, MSC, along with associated decoding result labels, L, of a selected label level, LL, and/or along with the corresponding data signal trace, A, of the data signal, DS.

14. An apparatus for processing a data signal transferred using a specific data protocol, DP,
said apparatus comprising:
   (a) a decoding unit configured to decode stepwise the data signal, DS, according to the used data protocol, DP, wherein said decoding unit is adapted to decode in a decoding step rising and falling signal edges as an intermediate decoding result;
   (b) a decoding result labelling unit configured to provide intermediate decoding result labels, L, for the data signal, DS, after each decoding step performed by said decoding unit and configured to map the provided decoding result labels, L, to the data signal, DS; and
   (c) a memory unit adapted to store decoding result labels (L) for intermediate and/or final decoding results provided by a decoding step performed by said decoding unit of said apparatus;
wherein the decoding result labels (L) for intermediate and/or final decoding results comprise bit labels, B, synchronized bit labels, SB, signal edge labels, E, data symbol labels, SYMB, data word labels, DW, data field labels, DF, and protocol message labels, PM, of the used data protocol, DP.

15. The apparatus according to claim 14 comprising a user interface adapted to select a data protocol, DP, and/or a decoding step for decoding a data signal, DS, using said data protocol, DP, and/or to select a label level, LL, for labelling the data signal, DS, and/or to select at least one decoding result label, L, at a selected label level, LL.

16. The apparatus according to claim 14 further comprising an analyzing unit configured to analyze the data signal, DS, with the mapped decoding result labels, L, for fault detection in the transferred data signal, DS.

17. The apparatus according to claim 16 wherein the analyzing unit is configured to detect faulty protocol messages, fMSG, in a sequence of decoded protocol messages and is configured to evaluate for each faulty protocol message, fMSG, an associated label sequence of a selected label level, LL, to identify a correct substitute protocol message, sMSG, for said faulty protocol message, fMSG.

18. The apparatus according to claim 17 wherein the detected faulty protocol message, fMSG, is automatically marked by said analyzing unit as faulty.

19. The apparatus according to claim 18, wherein the faulty protocol message, fMSG, is substituted by the identified substitute protocol message, sMSG.

20. The apparatus according to claim 14 comprising a display unit configured to display a data signal trace, A, of said data signal, DS, along with the decoding result labels (L) of a selected label level (LL).

21. The apparatus according to claim 16, wherein a sequence of decoded protocol messages, MSG, are output in a list and/or in a message sequence chart, MSC, along with associated decoding result labels, L, of a selected label level, LL, and/or along with the corresponding data signal trace, A, of the data signal, DS.

22. An oscilloscope comprising:
   a processing unit for processing a data signal, DS, transferred using a specific data protocol, DP,
   said processing unit having:
      a decoding unit configured to decode stepwise the data signal, DS, according to the used data protocol, DP, wherein said decoding unit is adapted to decode in a decoding step rising and falling signal edges of the data signal, DS, as an intermediate decoding result;
      a decoding result labelling unit configured to provide intermediate decoding result labels, L, for the data signal, DS, after each decoding step performed by said decoding unit and configured to map the provided decoding result labels, L, to the data signal, DS,
   said oscilloscope further comprising a user interface adapted to select a data protocol, DP, and/or a decoding step for decoding the data signal, DS, using the data protocol and/or to select a label level, LL, of decoding result labels, L;
   an output unit configured to output a data signal trace, A, of said data signal, DS, along with decoding result labels, L, of the selected label level, LL, provided by said decoding result labelling unit; and
   a memory unit adapted to store decoding result labels (L) for intermediate and/or final decoding results provided by a decoding step performed by said decoding unit;
wherein the decoding result labels (L) for intermediate and/or final decoding results comprise bit labels, B, synchronized bit labels, SB, signal edge labels, E, data symbol labels, SYMB, data word labels, DW, data field labels, DF, and protocol message labels, PM, of the used data protocol, DP.

23. A method for processing a data signal transferred using a data protocol,
the method comprising the steps of:
   (a) detecting in a decoding step rising and falling signal edges of the data signal, DS;
   (b) providing a corresponding signal edge label, E, for each detected signal edge; and
   (c) mapping the provided signal edge labels, E, to the data signal, DS;
wherein in a decoding step data symbols are derived on the basis of the data bits depending on a line code of said data protocol, DP, as an intermediate decoding result and labelled with corresponding data symbol labels, SYMB; and
wherein in a decoding step data words are derived on the basis of the data symbols as an intermediate decoding result and labelled with corresponding data word labels, DW.

24. An apparatus for processing a data signal transferred using a data protocol,
said apparatus comprising:
   a decoding unit configured to detect in a decoding step rising and falling signal edges of the data signal, DS;
   a decoding result labelling unit configured to provide corresponding signal edge labels, E, for each detected signal edge and configured to map the provided signal edge labels, E, to the data signal, DS; and
   a memory unit adapted to store decoding result labels (L) for intermediate and/or final decoding results provided by a decoding step performed by said decoding unit of said apparatus;

wherein the decoding result labels (L) for intermediate and/or final decoding results comprise bit labels, B, synchronized bit labels, SB, signal edge labels, E, data symbol labels, SYMB, data word labels, DW, data field labels, DF, and protocol message labels, PM, of the used data protocol, DP.

* * * * *